United States Patent
Behl

(10) Patent No.: US 10,069,496 B1
(45) Date of Patent: Sep. 4, 2018

(54) CIRCUIT FOR COMPENSATING FOR BOTH ON AND OFF-CHIP VARIATIONS

(71) Applicant: NXP USA, INC., Austin, TX (US)

(72) Inventor: Ankur Behl, Noida (IN)

(73) Assignee: NXP USA, INC., Austin, TX (US)

( * ) Notice: Subject to any disclaimer, the term of this patent is extended or adjusted under 35 U.S.C. 154(b) by 35 days.

(21) Appl. No.: 15/585,048

(22) Filed: May 2, 2017

(51) Int. Cl.
| H03K 19/003 | (2006.01) |
| H03K 5/133 | (2014.01) |
| G06F 1/10 | (2006.01) |
| G11C 7/22 | (2006.01) |
| G11C 7/04 | (2006.01) |
| H03K 5/00 | (2006.01) |

(52) U.S. Cl.
CPC ......... H03K 19/00369 (2013.01); G06F 1/10 (2013.01); G11C 7/04 (2013.01); G11C 7/222 (2013.01); H03K 5/133 (2013.01); H03K 19/00323 (2013.01); H03K 2005/00019 (2013.01); H03K 2005/00143 (2013.01)

(58) Field of Classification Search
CPC .............................................. H03K 19/00369
See application file for complete search history.

(56) References Cited

U.S. PATENT DOCUMENTS

| 6,940,768 B2 | 9/2005 | Dahlberg et al. |
| 6,985,401 B2 | 1/2006 | Jang et al. |
| 7,590,008 B1 | 9/2009 | Rose et al. |
| 8,355,294 B2 | 1/2013 | Makwana et al. |
| 8,395,436 B2 * | 3/2013 | Zimlich ................ H03L 7/0814 327/512 |
| 8,742,815 B2 * | 6/2014 | Wadhwa ........... H03K 3/356104 327/262 |
| 8,901,983 B1 * | 12/2014 | Ruffieux ................ G04G 3/022 327/262 |
| 9,251,906 B1 | 2/2016 | Jain et al. |
| 9,355,691 B2 | 5/2016 | Singh et al. |
| 9,361,117 B2 | 6/2016 | Behl et al. |

* cited by examiner

*Primary Examiner* — Hai L Nguyen
(74) *Attorney, Agent, or Firm* — Charles E. Bergere

(57) ABSTRACT

A system-on-chip (SOC) includes a compensation circuit that compensates for PVT variations of the SoC and an external memory connected to the SOC. The compensation circuit includes first through third delay calculators, first through third delay circuits, first through third latches, first and second comparators, and a delay control circuit. The delay calculators generate first through third delay count data. The delay circuits use three delay counts to generate first through third clock signals. The latches receive data stored in the external memory, and output start-point, mid-point, and end-point data, respectively. The first and second comparators generate increment or decrement signals based on the start-point, mid-point and end-point data comparisons. The delay control circuit generates modified first delay count data, which along with the first through third delay count data, compensate for the PVT variations of the SoC and the external memory.

20 Claims, 5 Drawing Sheets

CIRCUIT FOR COMPENSATING FOR BOTH ON AND OFF-CHIP VARIATIONS

BACKGROUND

The present invention relates to integrated circuits and, more particularly, to delay management and compensating for on and off-chip process, voltage, and temperature (PVT) variations in integrated circuits.

Some semiconductor devices are connected to a controller for receiving clock signals for performing operations such as reads, writes, data processing, and the like. Examples of such semiconductor devices include input/output (I/O) drivers, flash memories, universal bus transmitters, voltage regulators, analog-to-digital converters (ADCs), digital-to-analog converters (DACs), etc. A system-on-chip (SoC) is an integrated circuit (IC) that includes multiple circuits including a controller that provides clock signals to the circuits. The SoC may be connected to multiple external memories for receiving data. The external memories also receive clock signals from the controller. When the controller outputs the clock signals to an external memory, the clock signals pass through multiple logic modules before being received by the external memory, such as a printed circuit board (PCB), a programmable logic array (PLA), and a programmable array logic (PAL), which introduce delays in the clock signals. When the external memory receives the clock signals, it outputs the data requested by the controller. The data is received by the controller by way of the multiple logic modules, thereby adding additional delay in reception of the data. The difference between the time when the controller outputs the clock signals and the time when the external memory outputs the data after receiving the clock signals corresponds to a valid time.

The controller operates at high frequency to fetch a maximum amount of data from the external memory in a given time period. The external memory outputs the data, at every valid clock edge of the data read instruction. At high operating frequencies, external memory, like Flash memory, takes approximately 80% of the clock cycle of a data read instruction to output the valid data, so the controller is left with just the remaining 20% of the clock cycle to capture the data from the external memory—this is called a read data valid window. Due to the long read data path from the external device to the controller, along with the fact that the read data valid window is much smaller than the clock cycle, the controller may not have enough time to capture the valid data, which can result in data loss. Such data loss can be a critical issue especially, for example, if data being fetched is boot data essential for booting the system.

As the number of semiconductor devices and components included in the system is increasing, the size of the boot data required for booting the system also is increasing. The boot data includes a directory of operation codes (opcodes) that initialize the semiconductor devices and the components of the system. The controller must capture the boot data in the available read data valid window. At high frequency, due to the small duration of the read data valid window, the controller may be unable to read the boot data, which can lead to unreliable system boot or even failure to boot at high interface frequencies.

A known technique to solve the problem of not being able to reliably read the boot data at high frequencies is to use delay cells to shift the clock so that the clock edges lie within the valid read data window. Typically, the delay cells include multiple digital circuits such as logic gates and multiplexers, which introduce a delay in the clock signal of the controller receiving the data from the external memory. The delay cells ensure that the controller has sufficient time to receive the data. The delay corresponds to a phase shift in the clock signal.

As is well known, changes in operating conditions such as ambient temperature, operating voltage, and circuit delays caused by process variations (collectively PVT variations) affect the delay introduced by the delay cells. The delay cells have a fixed delay value for each PVT corner. A PVT corner indicates a speed of operation given a supply voltage and an operating temperature of the semiconductor device and/or the external memory. For instance, the PVT corner (fast, 1.1 volts, −25° C.), corresponds to a fast speed of operation at a supply voltage of 1.1 V and an operating temperature of −25° C. of the semiconductor device. Thus, change in the PVT corners of the delay cells leads to a mismatch in the delay introduced in the clock signal and the read data valid window. The mismatch further leads to data loss in read operations. As the delay cells do not introduce different delays when the controller and the external memories are at different PVT corners, the use of the delay cells to shift the clock so that the clock edge of the clock is present in the read data valid window is not effective. Further, the delay cells only attempt to accommodate on-chip PVT variations, but not off-chip PVT variations, which further exacerbates the problem.

Thus, it would be advantageous to have a system that can compensate for both on and off-chip PVT variations.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
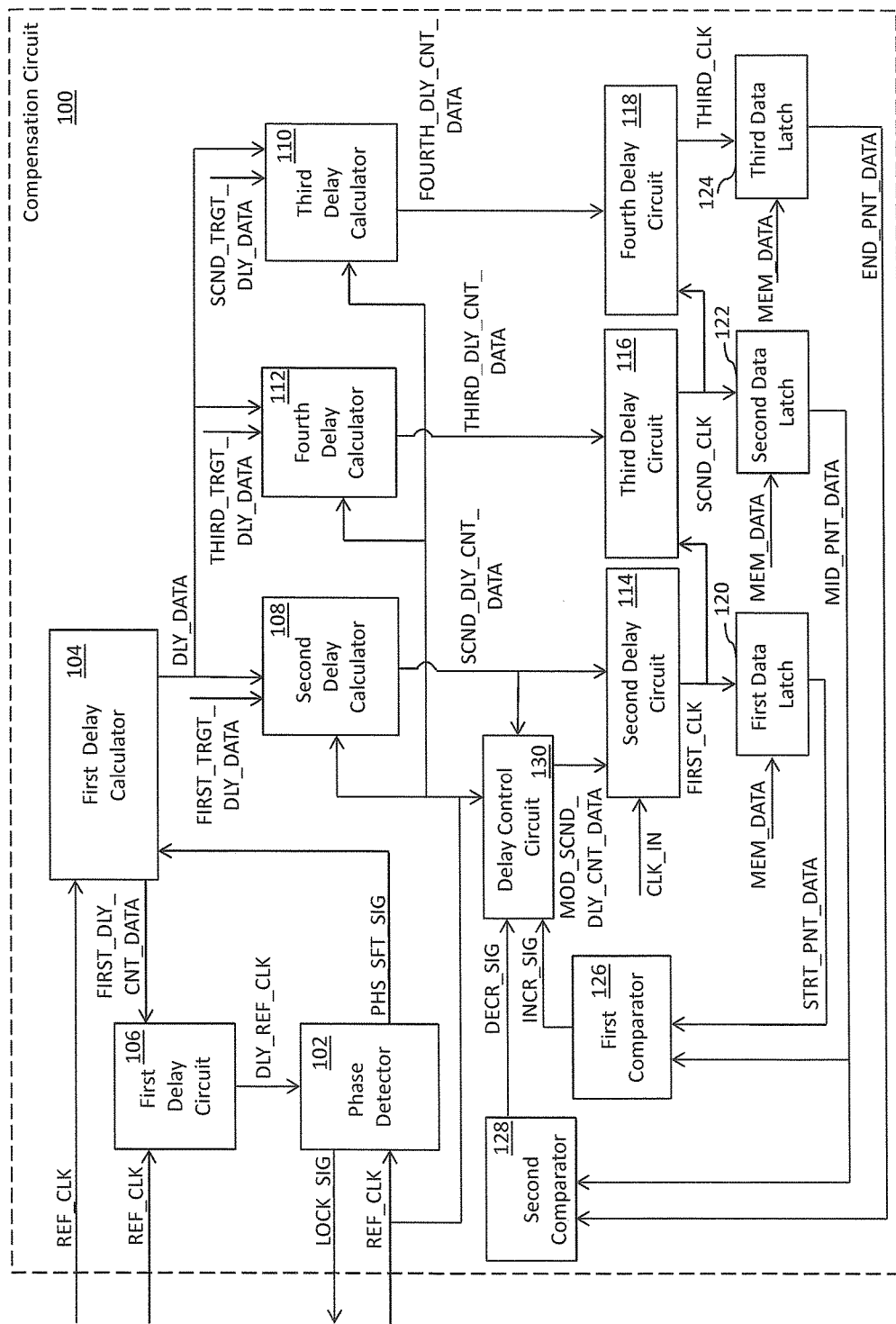
FIG. 1 is a schematic block diagram of a compensation circuit in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In one embodiment, the present invention provides a compensation circuit that compensates for on and off-chip PVT variations. The compensation circuit is connected to an external memory. The compensation circuit includes a phase detector, first through third delay calculators, first through third delay circuits, first through third data latches, first and second comparators, and a delay control circuit. The first through third delay calculators receive first through third target delay data, respectively. Each of the first through third delay calculators receive a reference clock signal and delay data. The first through third delay calculators output first through third delay count data, respectively. The first through third delay count data, enable compensation for the on-chip PVT variations. The first delay circuit receives an input clock signal and modified first delay count data. The first delay circuit is connected to the first delay calculator for receiving the first delay count data. The first delay circuit outputs a first clock signal based on the first delay count data or the modified first delay count data, and the input clock signal. The second delay circuit is connected to the second delay calculator for receiving the second delay count data and the first delay circuit for receiving the first clock signal. The second delay circuit outputs a second clock signal. The third delay circuit is connected to the third delay calculator for receiving the third delay count data and the second delay circuit for receiving the second clock signal. The third delay circuit outputs a third clock signal. The first through third delay circuits are connected in series. The first latch is connected to the external memory for receiving data stored in the external memory and the first delay circuit for receiving the first clock signal. The first latch outputs start-point data based on the first clock signal. The second latch is connected to the external memory for receiving the stored in the external memory and the second delay circuit for receiving the second clock signal. The second latch outputs mid-point data based on the second clock signal. The third latch is connected to the external memory for receiving the data stored in the external memory and the third delay circuit for receiving the third clock signal. The third latch outputs end-point data based on the third clock signal. The first comparator is connected to the first and second latches for receiving the start-point data and the mid-point data, respectively. The first comparator compares the start-point data and the mid-point data, and outputs an increment signal based on the comparison between the start-point data and the mid-point data. The second comparator is connected to the second and third latches for receiving the mid-point data and the end-point data, respectively. The second comparator compares the mid-point data and the end-point data, and outputs a decrement signal based on comparison between the mid-point data and the end-point data. The delay control circuit is connected to the first delay calculator for receiving the first delay count data, the first comparator for receiving the increment signal, and the second comparator for receiving the decrement signal. The delay control circuit outputs the modified first delay count data based on the increment signal or the decrement signal, and the second delay count data. The modified first delay count data compensates for the off-chip PVT variations of the external memory.

In another embodiment, the present invention provides a method for compensating for on and off-chip PVT variations using a compensation circuit. The method comprises generating first delay count data based on delay data and first target delay data by a first delay calculator. The first delay calculator is connected to a master delay calculator for receiving the delay data. The method further comprises generating second delay count data based on the delay data and second target delay data by a second delay calculator. The second delay calculator is connected to the master delay calculator for receiving the delay data. The method further comprises generating third delay count data based on the delay data and third target delay data by a third delay calculator. The third delay calculator is connected to the master delay calculator for receiving the delay data. The first through third delay count data enable compensation for the on-chip PVT variations. The method further comprises generating a first clock signal based on the first delay count data or modified first delay count data, and an input clock signal by a first delay circuit. The first delay circuit receives the first delay count data and the modified first delay count data from the first delay calculator and a delay control circuit, respectively. The method further comprises receiving memory data and the first clock signal by a first latch from an external memory and the first delay circuit, respectively. The method further comprises outputting start-point data based on the first clock signal and the memory data by the first latch. The method further comprises generating a second clock signal based on the second delay count data and the first clock signal by a second delay circuit. The second delay circuit receives the second delay count data and the first clock signal from the second delay calculator and the first delay circuit, respectively. The method further comprises receiving the memory data and the second clock signal by a second latch and the second delay circuit, respectively. The method further comprises outputting mid-point data based on the second clock signal and the memory data by the second latch. The method further comprises generating a third clock signal based on the third delay count data and the second clock signal by a third delay circuit. The third delay circuit receives the third delay count data and the second clock signal from the third delay calculator and the second delay circuit, respectively. The first through third delay circuits are connected in series. The method further comprises receiving the memory data and the third clock signal by a third latch from the external memory and the third delay circuit, respectively, and outputting end-point data based on the third clock signal and the memory data by the third latch. The method further comprises comparing the start-point data and the mid-point data by a first comparator, and generating an increment signal based on the comparison between the start-point data and the mid-point data. The method further comprises comparing the mid-point data and the end-point data by a second comparator, and generating a decrement signal based on comparison between the mid-point data and the end-point data. The modified first delay count data is generated based on the increment signal or the decrement signal, and the first delay count data by the delay control circuit. The modified first delay count data compensates for the off-chip PVT variations of the external memory.

In yet another embodiment, the present invention provides a system including an external memory and a SoC. The SoC includes a controller and a compensation circuit. The external memory stores memory data. The controller generates a reference clock signal, an input clock signal and first through third target delay data. The compensation circuit compensates for on and off-chip PVT variations. The compensation circuit is connected to the external memory. The compensation circuit includes a phase detector, first through third delay calculators, first through third delay circuits, first through third data latches, first and second comparators, and a delay control circuit. The first through third delay calculators receive first through third target delay data, respectively. Each of the first through third delay calculators receive a reference clock signal and delay data. The first through third delay calculators output first through third delay count data, respectively. The first through third delay count data enable compensation for the on-chip PVT variations of the SoC. The first delay circuit receives an input clock signal and modified first delay count data. The first delay circuit is connected to the first delay calculator for receiving the first delay count data. The first delay circuit outputs a first clock signal based on the first delay count data or the modified first delay count data, and the input clock signal. The second delay circuit is connected to the second delay calculator for receiving the second delay count data and the first delay circuit for receiving the first clock signal. The second delay circuit outputs a second clock signal. The third delay circuit is connected to the third delay calculator for receiving the third delay count data and the second delay circuit for receiving the second clock signal. The third delay circuit outputs a third clock signal. The first latch is connected to the external memory for receiving data stored in the external memory and the first delay circuit for receiving the first clock signal. The first through third delay circuits are connected in series. The first latch outputs start-point data based on the first clock signal. The second latch is connected to the external memory for receiving the stored in the external memory and the second delay circuit for receiving the second clock signal. The second latch outputs mid-point data based on the second clock signal. The third latch is connected to the external memory for receiving the data stored in the external memory and the third delay circuit for receiving the third clock signal. The third latch outputs end-point data based on the third clock signal. The first comparator is connected to the first and second latches for receiving the start-point data and the mid-point data, respectively. The first comparator compares the start-point data and the mid-point data, and outputs an increment signal based on the comparison between the start-point data and the mid-point data. The second comparator is connected to the second and third latches for receiving the mid-point data and the end-point data, respectively. The second comparator compares the mid-point data and the end-point data, and outputs a decrement signal based on comparison between the mid-point data and the end-point data. The delay control circuit is connected to the first delay calculator for receiving the first delay count data. The delay control circuit is connected to the first comparator for receiving the increment signal and the second comparator for receiving the decrement signal. The delay control circuit outputs the modified first delay count data based on the increment signal or the decrement signal, and the second delay count data. The modified first delay count data compensates for the off-chip PVT variations of the external memory.

Various embodiments of the present invention provide a compensation circuit for compensating for on and off-chip PVT variations in a system-on-chip (SoC). The compensation circuit includes a phase detector, a master delay calculator, a master delay circuit, first through third delay calculators, first through third delay circuits, first through third latches, first and second comparators, and a delay control circuit. The first through third delay calculators receive delay data which is PVT compensated. The first through third delay calculators output first through third delay count data, respectively, based on the delay data. Thus, the first through third delay count data compensates for the on-chip PVT variations. Further, the first through third latches receive memory data from an external memory. The first through third latches output start-point data, mid-point data, and end-point data, respectively. The first comparator compares the start-point data and the mid-point data, and based on comparison outputs an increment signal. A second comparator compares the mid-point data and the end-point data, and based on comparison outputs a decrement signal. The delay control circuit receives the first delay count data and either of the increment signal or the decrement signal. The delay control circuit outputs modified first delay count data based on the increment signal or the decrement signal, and the first delay count data. The modified first delay count data compensates for the off-chip PVT variations of the external memory. The start-point data, mid-point data, and end-point data are captured using first to third clock signals, respectively. The first through third clock signals include clock edges at a start-point, end-point, and mid-point of a read data valid window. The first and second comparators continuously monitor the start-point data, the mid-point data, and the end-point data. Further, the delay control circuit continuously shifts the first through third clock signals based on the PVT variations of the external memory. Thus, the compensation circuit does not lose a read data valid window. Additionally, the first and second comparators continuously monitor shifts in the read data valid window, thereby eliminating the need to manually re-calibrate the compensation circuit to capture the read data valid window. Thus, the compensation circuit compensates for the PVT variations of the external memory and the SoC and operates effectively in high speed data transfer operations.

Referring now to FIG. 1, a schematic block diagram of a compensation circuit 100 in accordance with an embodiment of the present invention is shown. The compensation circuit 100 includes a phase detector 102, a master delay calculator 104, a master delay circuit 106, first through third delay calculators 108-112, first through third delay circuits 114-118, first through third latches 120-124, first and second comparators 126 and 128, and a delay control circuit 130.

To overcome on-chip timing issues, the present invention uses a delay lock loop (DLL) circuit to introduce a delay and to compensate for PVT variations impacting delay cells. The DLL circuit is used to determine the delay for achieving a required phase shift. Although the delay varies based on the PVT corner at which the SoC is operating, the required phase shift of the clock cycle to achieve the delay remains constant regardless of the PVT corners of the SoC.

A general DLL solution uses a "Single Master-Single Slave" configuration. That is, the master delay generates the PVT compensation codes for a single slave delay line. The DLL circuit includes a master circuit and a slave circuit. The master circuit determines the delay required in the clock cycle based on the change in the PVT corners of the SoC. The delay is determined by calculating the difference in phase of a previous output from the master circuit with an input clock. Based on the delay computed by the master circuit, the DLL circuit automatically updates the delay in the slave circuit, thereby compensating for the PVT variations impacting the delay cells and hence the reliability of communication between the on-chip circuit modules of the SoC. However, when the SoC interfaces with external memory, the DLL circuit does not compensate for the delay in clock cycles that occur due to PVT variations of the off-chip parts (i.e., the PCB and the external memory). Accordingly, in a preferred embodiment of the present invention, a "Single Master-Multiple Slave" configuration is used.

In one embodiment, as will be discussed in more detail below, the single master-multiple slave configuration provides three different on-chip PVT compensated delay data values, for off-chip variation control. A master delay circuit (master delay line) is used by a single master delay calculator to generate delay data. The delay data then is used to calculate three different delay values that drive three slave delay lines (first through third delay circuits), with the three slave delay lines connected in series, which allows delay count data, generated using the delay data as input, get PVT compensated, thus providing three PVT compensated delay values, which then are used to drive three slave delay lines. As and when off-chip variations trigger further variations, modified delay count data is generated. Since the three delay lines are connected in series, the change in the modified delay count data effects all three delay lines for the off-chip variations as well.

Figure 2:
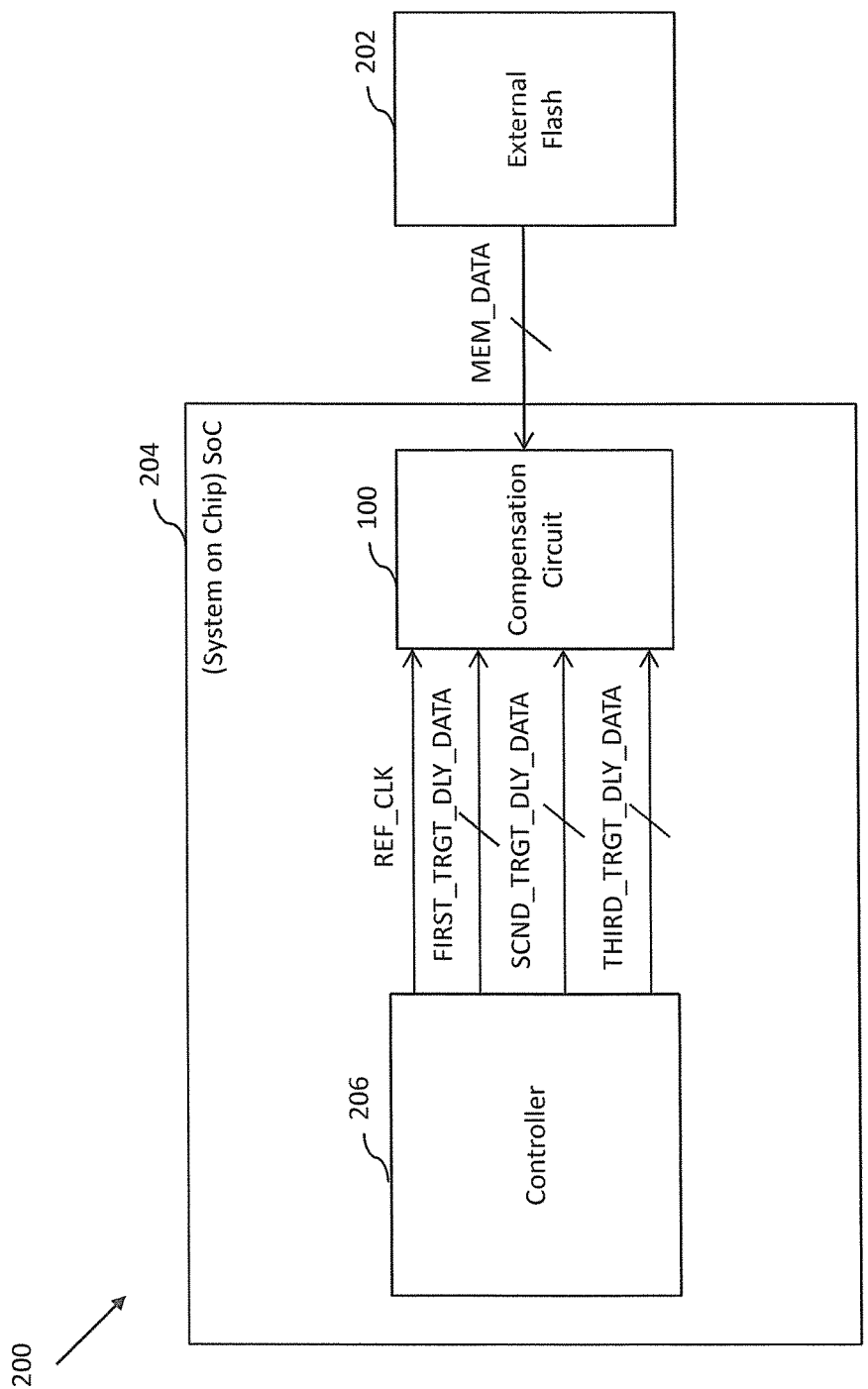
FIG. 2 is a schematic block diagram of a system that includes a SoC, which includes the compensation circuit of FIG. 1, in accordance with an embodiment of the present invention.

FIG. 2 is a schematic block diagram of a system 200 that includes an external memory 202 and a system-on-chip (SoC) 204 in accordance with an embodiment of the present invention is shown. The SoC 204 includes a controller 206 and the compensation circuit 100. Examples of the SoC 204 include automotive microcontrollers, Snapdragon processors available from Qualcomm, Inc. of San Diego, Calif., and various microprocessors and microcontrollers available from NXP Semiconductors N.V. of Austin, Tex., as well as processors and microcontrollers available from other semiconductor companies. The SoC 204 includes multiple logic circuits. Examples of the multiple logic circuits include input/output (I/O) drivers, flash memories, universal bus transmitters, analog-to-digital converters (ADCs), digital-to-analog convertors DACs, and the like. Examples of the controller 206 include a network interface controller (NIC), a memory controller, a small computer system interface (SCSI) controller, and the like.

The compensation circuit 100 finds application in SoCs 204 that read data from external devices. Examples of external devices include external memories, random access memories, read-only memories, multiple SoCs, transceivers, and the like. For instance, the compensation circuit 100 compensates for the PVT variations while fetching system and application data from the external memory 202 by the SoC 204 in an automobile during a system boot.

The compensation circuit 100 compensates for PVT variations of the multiple logic circuits on the SoC 204. Typically, the phase detector 102 receives two signals of same/different phases. The phase detector 102 determines a phase difference between the two signals of same/different phase.

When the compensation circuit 100 receives a first enable signal (not shown), the phase detector 102 receives a reference clock signal REF_CLK and a delayed reference clock signal DLY_REF_CLK from the controller 206 and the master delay circuit 106, respectively. The phase detector 102 determines a phase shift between the reference clock signal REF_CLK and the delayed reference clock signal DLY_REF_CLK. Ideally, desired phase shift between the reference clock signal REF_CLK and the delayed reference clock signal DLY_REF_CLK is one of 180° and 360°. When the phase shift between the reference clock signal REF_CLK and the delayed reference clock signal DLY_REF_CLK equals one of the desired phase shifts, the phase detector 102 generates a lock signal LOCK_SIG. The phase detector 102 then compares at every clock cycle, the phase shift between the reference clock signal REF_CLK and the delayed reference clock signal DLY_REF_CLK with the desired phase shift and calculates a temporary phase shift. The temporary phase shift is a PVT induced phase difference between the desired phase shift (180° or) 360° and the phase shift between the reference clock signal REF_CLK and the delayed reference clock signal DLY_REF_CLK. The phase detector 102 outputs the temporary phase shift as a phase shift signal PHS_SFT_SIG, which is used by the master delay calculator 104 to maintain the desired phase shift.

The master delay calculator 104 is connected to the phase detector 102 and the controller 206 for receiving the phase shift signal PHS_SFT_SIG and the reference clock signal REF_CLK, respectively. The master delay calculator 104 generates the fourth delay count data FOURTH_DLY_CNT_DATA that is required to generate the desired phase shift, i.e., at least a half-phase (180°) shift between the reference clock signal REF_CLK and delayed reference clock signal DLY_REF_CLK. The master delay calculator 104 determines the number of delay taps required to match the phase shift between the reference clock signal REF_CLK and the delayed reference clock signal DLY_REF_CLK to the desired phase shift. The master delay calculator 104, regularly generates and updates fourth delay count data FOURTH_DLY_CNT_DATA, which is based on the phase shift signal PHS_SFT_SIG. The master delay calculator 104 also generates and updates delay data DLY_DATA, which is based on the phase shift signal PHS_SFT_SIG. The delay data DLY_DATA is a reference number of delay tap value to generate three on-chip PVT compensated delay values, i.e., first through third delay count data FIRST_DLY_CNT_DATA-THIRD_DLY_CNT_DATA, for the first through third delay circuits 114-118. The reference number of delay tap value corresponds to an amount of phase shift generated by the delay tap. The first through third delay count data FIRST_DLY_CNT_DATA-THIRD_DLY_CNT_DATA, which depends on the delay data DLY_DATA output by the master delay calculator 104, compensates for the on-chip PVT variations. The master delay calculator 104 outputs the delay data DLY_DATA when the phase detector 102 outputs the lock signal LOCK_SIG.

The master delay circuit 106 is connected to the master delay calculator 104 and the controller 206 for receiving the fourth delay count data FOURTH_DLY_CNT_DATA and the reference clock signal REF_CLK, respectively. The master delay circuit 106 introduces the phase shift in the reference clock signal REF_CLK. The phase shift in the reference clock signal REF_CLK is proportional to the number of delay taps indicated by the fourth delay count data FOURTH_DLY_CNT_DATA. The master delay circuit 106 introduces the phase shift in the reference clock signal REF_CLK to generate the delayed reference clock signal DLY_REF_CLK.

When the lock signal LOCK_SIG is output by the phase detector 102, the controller 206 determines first target delay data FIRST_TRGT_DLY_DATA, second target delay data SCND_TRGT_DLY_DATA, and third target delay data THIRD_TRGT_DLY_DATA based on a read data valid window. A read data valid window corresponds to a time period for fetching memory data MEM_DATA from the external memory 202 during the execution of a read instruction. The controller 206 iteratively checks for a start point of the read data valid window. When the controller 206 identifies the start point of the read data valid window, the controller 206 outputs first target delay data FIRST_TRGT_DLY_DATA. The first target delay data FIRST_TRGT_DLY_DATA is a delay in occurrence of the start point of the read data valid window after the execution of the read instruction. The controller 206 also iteratively checks for a terminating point of the read data valid window. When the controller 206 identifies the terminating point of the read data valid window, the controller 206 outputs third target delay data THIRD_TRGT_DLY_DATA. The third target delay data THIRD_TRGT_DLY_DATA is obtained by subtracting a delay in detecting terminating point of the read data valid window from the delay in detecting the start point of the read data valid window. Further, the controller 206 determines a mid-point of the read data valid window based on the first target delay data FIRST_TRGT_DLY_DATA and the third target delay data THIRD_TRGT_DLY_DATA to generate second target delay data SCND_TRGT_DLY_DATA. After calculating the first target delay data FIRST_TRGT_DLY_DATA, the second target delay data SCND_TRGT_DLY_DATA, and the third target delay data THIRD_TRGT_DLY_DATA, the controller 206 provides a second enable signal (not shown) to the compensation circuit 100. The compensation circuit 100 activates the first through third delay circuits 114-118 based on the second enable signal (not shown).

The first delay calculator 108 is connected to the master delay calculator 104 for receiving the delay data DLY_DATA. The first delay calculator 108 is connected to the controller 206 for receiving the first target delay data FIRST_TRGT_DLY_DATA and the reference clock signal REF_CLK. Further, the first delay calculator 108 determines the number of delay taps required by the first delay circuit 114 to introduce a delay equal to the first target delay data FIRST_TRGT_DLY_DATA based on the delay data DLY_DATA. The first delay calculator 108 outputs the first delay count data FIRST_DLY_CNT_DATA. The first delay count data FIRST_DLY_CNT_DATA is a number of delay taps needed by the first delay circuit 114 to introduce a delay equal to the first target delay data FIRST_TRGT_DLY_DATA. Additionally, as the first delay count data FIRST_DLY_CNT_DATA is computed by the first delay calculator 108 based on the delay data DLY_DATA, which is on-chip PVT compensated, the first delay count data FIRST_DLY_CNT_DATA is also on-chip PVT compensated.

The second delay calculator 110 is connected to the master delay calculator 104 for receiving the delay data DLY_DATA. The second delay calculator 110 is connected to the controller 206 for receiving the second target delay data SCND_TRGT_DLY_DATA and the reference clock signal REF_CLK. The second delay calculator 110 determines the number of delay taps required to introduce a delay equal to the second target delay data SCND_TRGT_DLY_DATA based on the delay data DLY_DATA. The second delay calculator 110 outputs the second delay count data SCND_DLY_CNT_DATA. The second delay count data SCND_DLY_CNT_DATA is a number of delay taps needed to introduce a delay equal to the second target delay data SCND_TRGT_DLY_DATA. Additionally, as the second delay count data SCND_DLY_CNT_DATA is computed by the second delay calculator 110 based on the delay data DLY_DATA, which is on-chip PVT compensated, the second delay count data SCND_DLY_CNT_DATA is also on-chip PVT compensated.

The third delay calculator 112 is connected to the master delay calculator 104 for receiving the delay data DLY_DATA. The third delay calculator 112 is connected to the controller 206 for receiving the third target delay data THIRD_TRGT_DLY_DATA and the reference clock signal REF_CLK. The third delay calculator 112 determines the number of delay taps needed to introduce a delay equal to the third target delay data THIRD_TRGT_DLY_DATA based on the delay data DLY_DATA. The third delay calculator 112 outputs the third delay count data THIRD_DLY_CNT_DATA. The third delay count data THIRD_DLY_CNT_DATA is the number of delay taps required to introduce a delay equal to the third target delay data THIRD_TRGT_DLY_DATA. Additionally, as the third delay count data THIRD_DLY_CNT_DATA is computed by the third delay calculator 112 based on the delay data DLY_DATA, which is on-chip PVT compensated, the third delay count data THIRD_DLY_CNT_DATA is also on-chip PVT compensated.

The first delay circuit 114 is connected to the controller 206 for receiving an input clock signal CLK_IN. The input clock signal CLK_IN is a clock signal having a frequency equal to a frequency of operation of the external memory 202. The first delay circuit 114 is connected to the first delay calculator 108 for receiving the first delay count data FIRST_DLY_CNT_DATA and to the delay control circuit 130 for receiving the modified first delay count data MOD_FIRST_DLY_CNT_DATA. The first delay circuit 114 determines a first temporary delay corresponding to the value of the first delay count data FIRST_DLY_CNT_DATA and/or the modified first delay count data MOD_FIRST_DLY_CNT_DATA. The first delay circuit 114 introduces the first temporary delay in the input clock signal CLK_IN and outputs a first clock signal FIRST_CLK, which is a delayed input clock signal CLK_IN. The first clock signal FIRST_CLK includes a delay corresponding to the first temporary delay.

The second delay circuit 116 is connected to the first delay circuit 114 for receiving the first clock signal FIRST_CLK. The second delay circuit 116 also is connected to the second delay calculator 110 for receiving the second delay count data SCND_DLY_CNT_DATA. The second delay circuit 116 determines a second temporary delay corresponding to the value of the second delay count data SCND_DLY_CNT_DATA. The second delay circuit 116 introduces the second temporary delay in the first clock signal FIRST_CLK and outputs a second clock signal SCND_CLK which is a delayed first clock signal FIRST_CLK. The second clock signal SCND_CLK includes a delay corresponding to the second temporary delay.

The third delay circuit 118 is connected to the second delay circuit 116 for receiving the second clock signal SCND_CLK. The third delay circuit 118 also is connected to the third delay calculator 112 for receiving the third delay count data THIRD_DLY_CNT_DATA. The third delay circuit 118 determines a third temporary delay corresponding to the value of the third delay count data THIRD_DLY_NT_DATA. The third delay circuit 118 introduces the third temporary delay in the second clock signal SCND_CLK and outputs a third clock signal THIRD_CLK, which is a delayed second clock signal SCND_CLK. The third clock signal THIRD_CLK includes a delay corresponding to the third temporary delay.

The first through third delay circuits 114-118 are connected in series. The input clock signal CLK_IN received by the first delay circuit 114 is delayed to generate the first clock signal FIRST_CLK. The first clock signal FIRST_CLK received by the second delay circuit 116 is delayed further to generate the second clock signal SCND_CLK. Finally, the second clock signal SCND_CLK received by the third delay circuit 118 is further delayed to generate the third clock signal THIRD_CLK. Thus, the input clock signal CLK_IN is delayed three times in series.

The first latch 120 is connected to the external memory 202 for receiving the memory data MEM_DATA. The memory data MEM_DATA includes system data and application data. The system data is responsible for booting the system 200, and loading and activating operation code (opcode) data. When the first latch 120 receives the first clock signal FIRST_CLK from the first delay circuit 114, the first latch 120 reads the memory data MEM_DATA from the external memory 202, and outputs the memory data MEM_DATA corresponding to the first clock signal FIRST_CLK as start-point data STRT_PNT_DATA. The first clock signal FIRST_CLK includes a clock edge that is at the start of the read data valid window.

The second latch 122 is connected to the external memory 202 for receiving the memory data MEM_DATA. When the second latch 122 receives the second clock signal SCND_CLK from the second delay circuit 116, the second latch 122 reads the memory data MEM_DATA from the external memory 202, and outputs the memory data MEM_DATA corresponding to the second clock signal SCND_CLK as mid-point data MID_PNT_DATA. The second clock signal SCND_CLK includes a clock edge that is at the midpoint of the read data valid window.

The third latch 124 is connected to the external memory 202 for receiving the memory data MEM_DATA. When the third latch 124 receives the third clock signal THIRD_CLK from the third delay circuit 118, the third latch 124 reads the memory data MEM_DATA from the external memory 202, and outputs the memory data MEM_DATA corresponding to the third clock signal THIRD_CLK as end-point data END_PNT_DATA. The third clock signal THIRD_CLK includes a clock edge that is at the terminating point of the read data valid window.

When the first through third latches 120-124 receive the first, second and third clock signals FIRST_CLK, SCND_CLK, and THIRD_SIG, respectively, within the read data valid window, the first through third latches 120-124 capture the memory data MEM_DATA. The clock edge in the first through third clock signals FIRST_CLK-THIRD_CLK triggers the first through third latches 120-124 to capture the memory data MEM_DATA. The first comparator 126 is connected to the first latch 120 for receiving the start-point data STRT_PNT_DATA and the second latch 122 for receiving the mid-point data MID_PNT_DATA. The first comparator 126 compares the start-point data STRT_PNT_DATA and the mid-point data MID_PNT_DATA, and outputs an increment signal INCR_SIG based on the comparison of the start-point data STRT_PNT_DATA and the mid-point data MID_PNT_DATA.

The second comparator 128 is connected to the second latch 122 for receiving the mid-point data MID_PNT_DATA and the third latch 124 for receiving the end-point data END_PNT_DATA. The second comparator 128 compares the mid-point data MID_PNT_DATA and the end-point data END_PNT_DATA, and outputs a decrement signal DECR_SIG based on the comparison of the mid-point data MID_PNT_DATA and the end-point data END_PNT_DATA.

In practical applications, the PVT corners of the external memory 202 change incrementally and differently from those of the SoC 204. In one example, when the external memory 202 is operating at a temperature higher than that of the SoC 204, the start point of the read data valid window arrives at a time after the clock edge of by the first clock signal FIRST_CLK. Thus, the first latch 120, which operates on the first clock signal FIRST_CLK, is unable to capture the memory data MEM_DATA at the clock edge of the first clock signal. As a result, the start-point data STRT_PNT_DATA will not match the mid-point data MID_PNT_DATA. To ensure that the read data valid window is not lost by the compensation circuit 100, the delay in the first clock signal FIRST_CLK must be increased. To increase the delay in the first clock signal FIRST_CLK, the first comparator 126 generates an increment signal INCR_SIG, thereby dynamically compensating for the off-chip PVT variations.

In another example, when the external memory 202 is operating at a temperature lower than that of the SoC 204, the terminating point of the read data valid window arrives at a time before the clock edge of the third clock signal THIRD_CLK. Thus, the third latch 124, which operates on the third clock signal THIRD_CLK, is unable to capture the memory data MEM_DATA. As a result the end-point data END_PNT_DATA will not match the mid-point data MID_PNT_DATA. To ensure that the read data valid window is not lost by the compensation circuit 100, the delay in the third clock signal THIRD_CLK must be decreased. Since the third clock signal THIRD_CLK is dependent on the second clock signal SCND_CLK and the second clock signal SCND_CLK is dependent on the first clock signal FIRST_CLK, the delay in the first clock signal FIRST_CLK must be decreased. To decrease the delay in the first clock signal FIRST_CLK, the second comparator 128 generates a decrement signal DECR_SIG, thereby dynamically compensating for the off-chip variations.

The compensation circuit 100 captures and holds the read data valid window during the read operation, as the first through third delay circuits 114-118 are provided with on-chip PVT compensated delay values (i.e. the first through third delay count data FIRST_DLY_CNT_DATA-THIRD_DLY_CNT_DATA), every clock cycle. Further, the first and second comparators 126 and 128 continuously monitor a shift in the read data valid window and adjust the delay in the input clock signal CLK_IN. Thus, identification of the read data valid window based on the first through third target delay data FIRST_TRGT_DLY_DATA-THIRD_TRGT_DLY_DATA is performed by the controller 206 only once and any subsequent changes in the shift of the read data valid window are accurately identified by the first and second comparators 126 and 128.

The delay control circuit 130 is connected to the first delay calculator 108 for receiving the first delay count data FIRST_DLY_CNT_DATA. The delay control circuit 130 also is connected to the first comparator 126 for receiving the increment signal INCR_SIG and to the second comparator 128 for receiving the decrement signal DECR_SIG. The delay control circuit 130 increments the value of the first delay count data FIRST_DLY_CNT_DATA by one delay tap on reception of the increment signal INCR_SIG or decrements the value of the first delay count data FIRST_DLY_CNT_DATA by one delay tap on reception of the decrement signal DECR_SIG. The delay control circuit 130 outputs the modified first delay count data MOD_FIRST_DLY_CNT_DATA based on at least one of the increment signal INCR_SIG and the decrement signal DECR_SIG. The modified first delay count data MOD_FIRST_DLY_CNT_DATA is based on the first delay count data FIRST_DLY_CNT_DATA, and the first delay count data FIRST_DLY_CNT_DATA is based on the first target delay data FIRST_TRGT_DLY_DATA. Thus, the compensation circuit 100 compensates for the PVT variations of the external memory 202 at every clock cycle.

In one example, the first comparator 126 receives the start-point data STRT_PNT_DATA and the mid-point data MID_PNT_DATA from the first and second latches 120 and 122, respectively. Similarly, the second comparator 128 receives the mid-point data MID_PNT_DATA and the end-point data END_PNT_DATA from the second latch 122 and the third latch 124, respectively. The first comparator 126 compares the start-point data STRT_PNT_DATA and the mid-point data MID_PNT_DATA. When the start-point data STRT_PNT_DATA does not match the mid-point data MID_PNT_DATA, the first comparator 126 outputs the increment signal INCR_SIG. Similarly, the second comparator 128 compares the mid-point data MID_PNT_DATA and the end-point data END_PNT_DATA. When the mid-point data MID_PNT_DATA does not match the end-point data END_PNT_DATA, the second comparator 128 outputs the decrement signal DECR_SIG. The delay control circuit 130 receives one of the increment signal INCR_SIG and the decrement signal DECR_SIG, and increments the value of the first delay count data FIRST_DLY_CNT_DATA by one delay tap on reception of increment signal INCR_SIG or decrements the value of the first delay count data FIRST_DLY_CNT_DATA by one delay tap on reception of the decrement signal DECR_SIG. When the start-point data STRT_PNT_DATA matches the mid-point data MID_PNT_DATA and the mid-point data MID_PNT_DATA matches the end-point data END_PNT_DATA, the PVT variations of the external memory 202 are compensated by the compensation circuit 100.

Figure 3A:
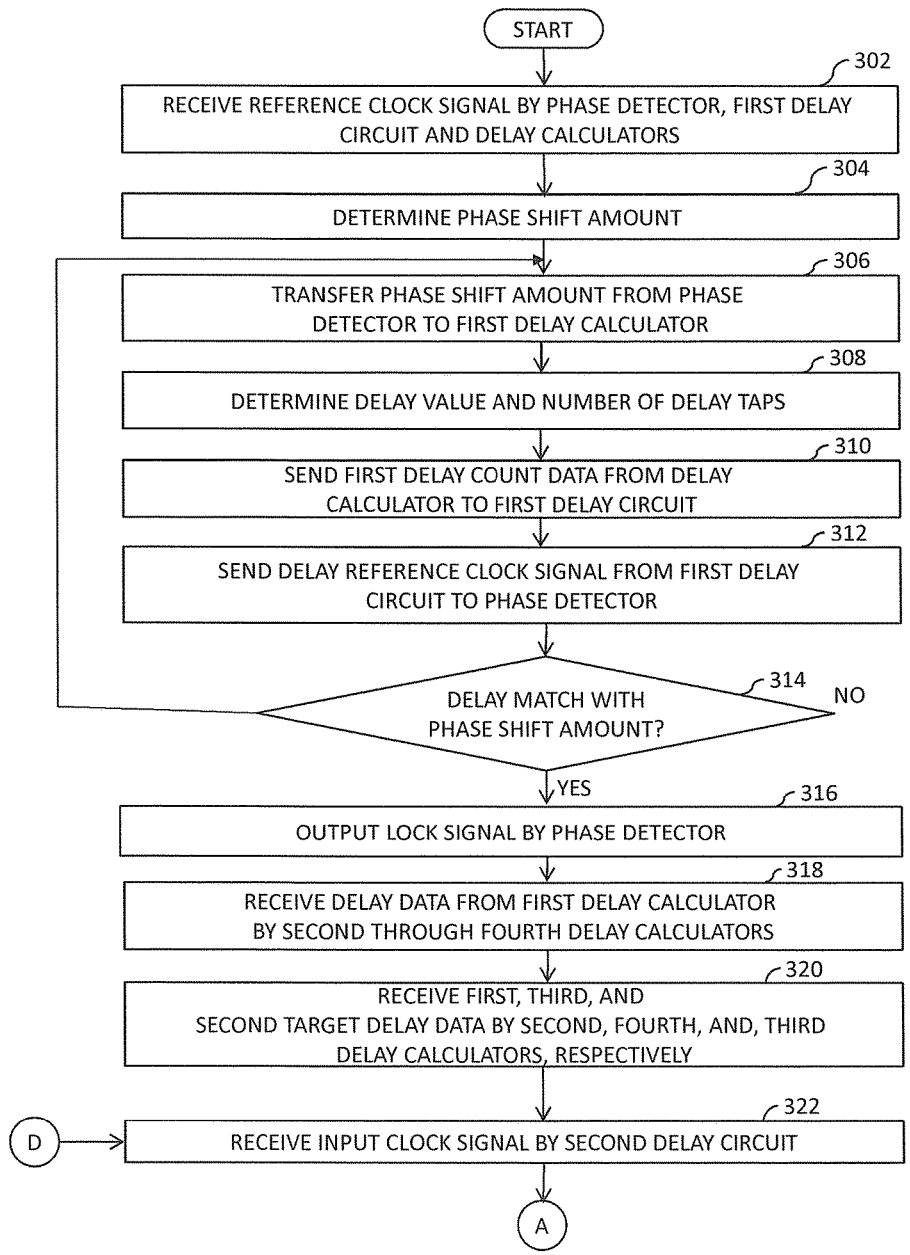
FIGS. 3A-3C are a flow chart to illustrate a method for compensating for on-chip and off-chip PVT variations by the compensation circuit of FIG. 1 in accordance with an embodiment of the present invention.
Figure 3B:
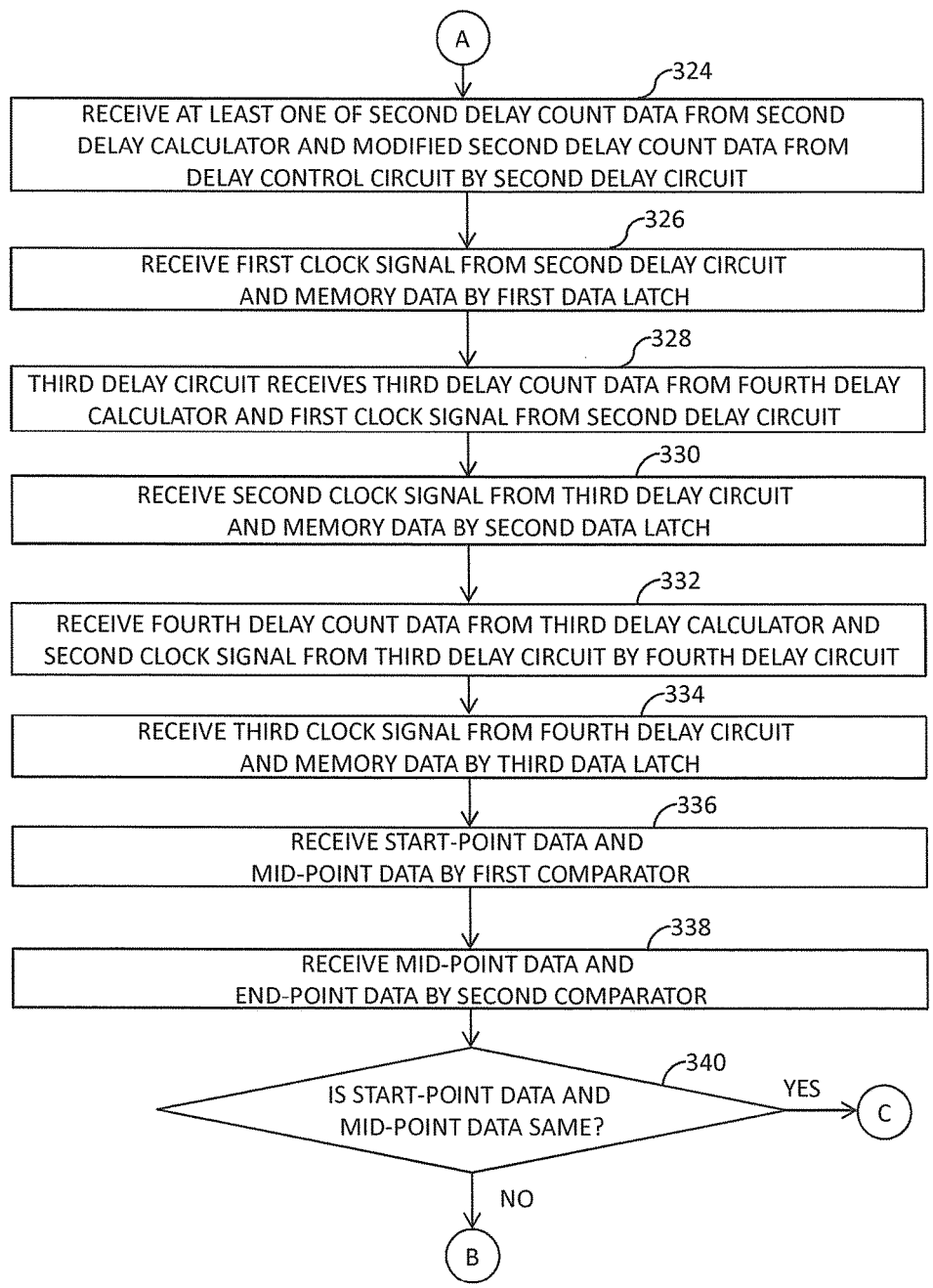
Figure 3C:
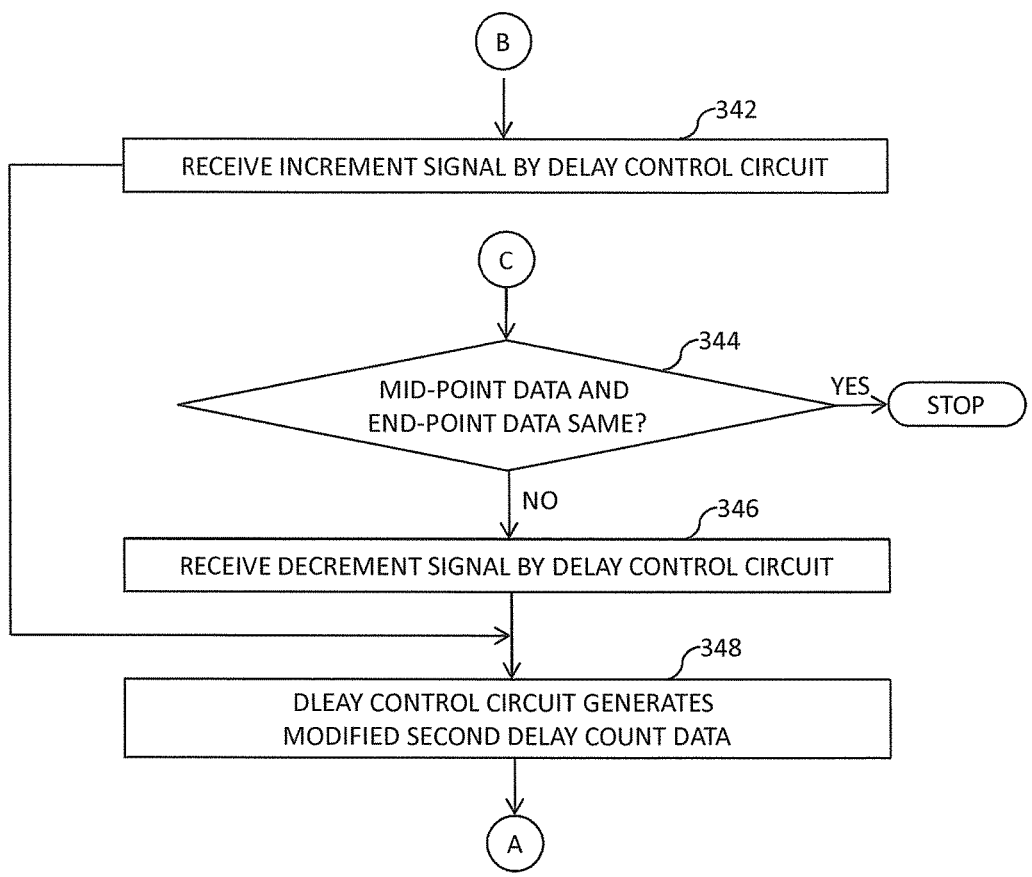

Referring now to FIGS. 3A and 3B, a flow chart illustrating a method for compensating for on and off-chip PVT variations by the compensation circuit 100 in accordance with an embodiment of the present invention is shown. At step 302, the first through third delay calculators 108-112 receive the delay data DLY_DATA from the master delay calculator 104. At step 304, the first through third delay calculators 108-112 receive first through third target delay data FIRST_TRGRT_DLY_DATA-THIRD_TRGT_DLY_DATA from the controller 206. At step 306, the first delay circuit 114 receives the input clock signal CLK_IN. At step 308, the first delay circuit 114 receives the first delay count data FIRST_DLY_CNT_DATA from the first delay calculator 108 or it receives the modified first delay count data MOD_FIRST_DLY_CNT_DATA from the delay control circuit 130. At step 310, the first latch 120 receives the memory data MEM_DATA from the external memory 202 at the first clock signal FIRST_CLK. The first latch 120 receives the first clock signal FIRST_CLK from the first delay circuit 114. At step 312, the second delay circuit 116 receives the second delay count data SCND_DLY_CNT_DATA from the second delay calculator 110 and the first clock signal FIRST_CLK from the first delay circuit 114. At step 314, the second latch 122 receives the memory data MEM_DATA from the external memory 202 at the second clock signal SCND_CLK. At step 316, the third delay circuit 118 receives the third delay count data THIRD_DLY_CNT_DATA from the third delay calculator 112 and the second clock signal SCND_CLK from the second delay circuit 116. At step 318, the third latch 124 receives the memory data MEM_DATA from the external memory 202 at the third clock signal THIRD_CLK. At step 320, the first comparator 126 receives the start-point data STRT_PNT_DATA and the mid-point data MID_PNT_DATA. At step 322, the second comparator 128 receives the mid-point data MID_PNT_DATA and the end-point data END_PNT_DATA. At step 324, the first comparator 126 compares the start-point data STRT_PNT_DATA with the mid-point data MID_PNT_DATA. If it is determined, at step 324, that the start-point data STRT_PNT_DATA does not match with the mid-point data MID_PNT_DATA, the first comparator 126 performs step 326. At step 326, the delay control circuit 130 receives the increment signal INCR_SIG from the first comparator 126. If it is determined, at step 324, that the start-point data STRT_PNT_DATA matches with the mid-point data MID_PNT_DATA, the first comparator 126 performs step 328. At the step 328, the second comparator 128 compares the mid-point data MID_PNT_DATA with the end-point data END_PNT_DATA. If it is determined, at step 328, that the mid-point data MID_PNT_DATA does not match the end-point data END_PNT_DATA, the second comparator 128 performs step 330. At step 330, the delay control circuit 130 receives the decrement signal DECR_SIG from the second comparator 128. If it is determined, at step 328, that the mid-point data MID_PNT_DATA matches the end-point data END_PNT_DATA, the compensation circuit 100 stops. After steps 326 and 330, the compensation circuit 100 performs step 332. At step 332, the delay control circuit 130 generates the modified first delay count data MOD_FIRST_DLY_CNT_DATA and executes step 308.

In the preferred embodiment, the number of delay taps in each of the master delay circuit 106, and the first through third delay circuit 114, 116, and 118 is equal. Further, the delay taps included in each of the master delay circuit 106, and the first through third delay circuits 114, 116, and 118 are structurally similar. Thus, the PVT characteristics of the master delay circuit 106, and the first through third delay circuits 114, 116, and 118 are same.

Further, the delay data DLY_DATA generated by the master delay calculator 104 is the reference for the first through third delay calculators 108-112, and the delay taps of the first through third delay circuits 114-118 act as slave delay taps corresponding to the delay taps of the master delay circuit 106. The delay data DLY_DATA is updated whenever there are variations in the on-chip PVT characteristics for maintaining the 180° or 360° phase shift in the reference clock signal REF_CLK. The delay data DLY_DATA further is used to calculate the first through third delay count data FIRST_DLY_CNT_DATA-THIRD_DLY_CNT_DATA. The first through third delay count data FIRST_DLY_CNT_DATA-THIRD_DLY_CNT_DATA generated using the delay data DLY_DATA are on-chip PVT compensated. The first through third delay count data FIRST_DLY_CNT_DATA-THIRD_DLY_CNT_DATA subsequently drive the first through third delay circuits 114-118 that act as slave delay circuits to the master delay circuit 106. Thus, the master delay circuit 106 and the first through third delay circuits 114-118 are thereby compensated for the on-chip PVT variations.

The compensation circuit 100 compensates for the on-chip PVT variations when the first through third delay count data FIRST_DLY_CNT_DATA-THIRD_DLY_CNT_DATA are generated based on the delay data DLY_DATA. The compensation for off-chip PVT variation is enabled only after the first through third delay count data FIRST_DLY_CNT_DATA-THIRD_DLY_CNT_DATA have been generated, thereby ensuring that the on-chip PVT variations are compensated first and the read data valid window is not lost due to on-chip PVT variations. Further, the PVT variations of the external memory 202 are continuously monitored by the first and second comparators 126 and 128 eliminating the need to generate the first through third delay count data FIRST_DLY_CNT_DATA-THIRD_DLY_CNT_DATA repeatedly.

Since the second latch 122 of the compensation circuit 100 always captures the memory data MEM_DATA for any change in the PVT characteristics of the external memory 202, and the first and second comparators 126 and 128 continuously monitor shifts in the read data valid window and adjust the delay in the input clock signal CLK_IN, the compensation circuit 100 is self-calibrating. Furthermore, as the compensation circuit 100 determines the on-chip and off-chip PVT variations simultaneously for every clock cycle even at very high operating frequencies, the compensation circuit 100 is efficient and reliable. Thus, the compensation circuit 100 compensates for PVT variations that impact communications between the multiple external or off-chip devices and the SoC 204.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A compensation circuit for compensating for on-chip and off-chip process, voltage, and temperature (PVT) variations, wherein the compensation circuit is connected to an external memory, the compensation circuit comprising:
  first through third delay calculators that receive a reference clock signal, delay data, and respective first through third target delay data, and output respective first through third delay count data that compensates for the on-chip PVT variations, wherein the second target delay data is based on the first target delay data, the third target delay data, and the first through third delay count data;
  a first delay circuit connected to the first delay calculator, wherein the first delay circuit receives the first delay count data, an input clock signal and modified first delay count data, and outputs a first clock signal based on at least one of the first delay count data, the modified first delay count data, and the input clock signal;
  a second delay circuit connected to the second delay calculator and the first delay circuit, wherein the second delay circuit receives the second delay count data and the first clock signal, and outputs a second clock signal;
  a third delay circuit connected to the third delay calculator and the second delay circuit, wherein the third delay circuit receives the third delay count data and the second clock signal, and outputs a third clock signal, and wherein the first through third delay circuits are connected in series;
  a first latch, connected to the external memory and the first delay circuit, for receiving data stored in the external memory and the first clock signal, and outputting start-point data based on the first clock signal;
  a second latch connected to the external memory and the second delay circuit, wherein the second latch receives the data stored in the external memory and the second clock signal, and outputs mid-point data based on the second clock signal;
  a third latch connected to the external memory and the third delay circuit, wherein the third latch receives the data stored in the external memory and the third clock signal, and outputs end-point data based on the third clock signal;
  a first comparator connected to the first and second latches for receiving and comparing the start-point data and the mid-point data, and outputting an increment signal based on the comparison between the start-point data and the mid-point data;
  a second comparator connected to the second and third latches for receiving and comparing the mid-point data and the end-point data, and outputting a decrement signal based on the comparison between the mid-point data and the end-point data; and
  a delay control circuit connected to the first delay calculator and at least one of the first and second comparators for receiving the first delay count data and at least one of the increment and decrement signals, and generating the modified first delay count data, wherein the modified first delay count data compensates for the off-chip PVT variations of the external memory.

2. The compensation circuit of claim 1, further comprising:
  a phase detector that receives a delayed reference clock signal and the reference clock signal, determines a phase shift based on difference between a desired phase shift and a phase shift between the reference clock signal and the delayed reference clock signal, and outputs a phase shift signal corresponding to the phase shift, and a lock signal based on the delayed reference clock signal;
  a master delay calculator connected to the phase detector that receives the phase shift signal and the reference clock signal, determines a delay value and a number of delay taps, and outputs the delay data corresponding to the delay value, and fourth delay count data corresponding to the number of delay taps; and
  a master delay circuit connected to the master delay calculator for receiving the fourth delay count data and the reference clock signal, and generating the delayed reference clock signal.

3. The compensation circuit of claim 2, wherein the first through third delay circuits, and the master delay circuit each include an equal number of delay taps.

4. The compensation circuit of claim 2, wherein the desired phase shift is one of 180° and 360° phase shift.

5. The compensation circuit of claim 1, wherein:
  the compensation circuit is connected to a controller,
  the compensation circuit receives the reference clock signal and the first through third target delay data;
  the controller determines the first target delay data based on a starting point of a read data window,
  the controller iteratively increases a value of the first target delay data to generate the third target delay data that corresponds to a terminating point of the read data window, and
  the second target delay data is generated based on the first target delay data and the third target delay data, wherein the second target delay data corresponds to a midpoint of the read data valid window.

6. The compensation circuit of claim 1, wherein the delay control circuit performs at least one of increment and decrement operations on the first delay count data to generate the modified first delay count data.

7. The compensation circuit of claim 1, wherein the external memory is a NOR flash memory.

8. A method for compensating for on-chip and off-chip process, voltage, and temperature (PVT) variations by a compensation circuit connected to an external memory, the method comprising:
  generating first delay count data based on delay data and first target delay data by a first delay calculator, wherein the first delay calculator is connected to a master delay calculator and receives the delay data therefrom;
  generating second delay count data based on the delay data and second target delay data by a second delay calculator, wherein the second delay calculator is connected to the master delay calculator and receives the delay data therefrom;
  generating third delay count data based on the delay data and third target delay data by a third delay calculator, wherein the third delay calculator is connected to the master delay calculator and receives the delay data therefrom, and wherein the first through third delay count data compensates for the on-chip PVT variations;
  generating a first clock signal by a first delay circuit based on at least one of the first delay count data, modified first delay count data, and an input clock signal, wherein the first delay circuit receives the first delay count data from the first delay calculator, and the modified first delay count data from a delay control circuit;
  receiving memory data from the external memory and the first clock signal from the first delay circuit, by a first data latch;

outputting start-point data based on the first clock signal and the memory data by the first data latch;
generating a second clock signal based on the second delay count data and the first clock signal by a second delay circuit, wherein the second delay circuit receives the second delay count data from the second delay calculator and the first clock signal from the first delay circuit;
receiving the memory data from the external memory and the second clock signal from the second delay circuit, by a second data latch;
outputting mid-point data based on the second clock signal and the memory data by the second data latch;
generating a third clock signal, based on the third delay count data and the second clock signal, by a third delay circuit, wherein the third delay circuit receives the third delay count data from the third delay calculator and the second clock signal from the second delay circuit, and wherein the first through third delay circuits are connected in series;
receiving the memory data from the external memory and the third clock signal from the third delay circuit, by a third data latch;
outputting end-point data based on the third clock signal and the memory data by the third data latch;
comparing the start-point data and the mid-point data with a first comparator and generating an increment signal based on the comparison between the start-point data and the mid-point data;
comparing the mid-point data and the end-point data with a second comparator and generating a decrement signal based on the comparison between the mid-point data and the end-point data; and
generating the modified first delay count data based on at least one of the increment signal, the decrement signal, and the first delay count data by the delay control circuit, wherein the modified first delay count data compensates for the off-chip PVT variations of the external memory.

9. The method of claim 8, further comprising:
receiving a reference clock signal and a delayed reference clock signal by a phase detector;
determining a phase shift based on difference between a desired phase shift and a phase shift between the reference clock signal and the delayed reference clock signal by the phase detector;
generating a phase shift signal and a lock signal based on the phase shift and the delayed reference clock signal, respectively, by the phase detector;
generating the delay data corresponding to a delay value and fourth delay count data corresponding to a number of delay taps, by the master delay calculator, wherein the master delay calculator determines the delay value and the number of delay taps based on the phase shift signal, and wherein the master delay calculator receives the phase shift signal from the phase detector; and
generating the delayed reference clock signal based on the fourth delay count data and the reference clock signal by a master delay circuit.

10. The method of claim 9, wherein the first through third delay circuits and the master delay circuit each include an equal number of delay taps, and wherein the delay taps included in the first through fourth delay circuits are structurally alike.

11. The method of claim 9, wherein the desired phase shift is one of 180° and 360° phase shift.

12. The method of claim 8, further comprising:
receiving the reference clock signal and the first through third target delay data from a controller,
wherein the controller:
determines the first target delay data based on a starting point of a read data window, and
iteratively increases a value of the first target delay data to generate the third target delay data,
wherein the third delay target delay data corresponds to a terminating point of the read data window, and
wherein the second target delay data is an average of the first target delay data and the third target delay data.

13. The method of claim 8, wherein the external memory is a NOR flash memory.

14. The method of claim 8, further comprising:
performing at least one of increment and decrement operations on the first delay count data by the delay control circuit to generate the modified first delay count data.

15. A system, comprising:
an external memory for storing memory data; and
a system-on-chip (SoC) including a controller that generates a reference clock signal and first through third target delay data, and a compensation circuit connected to the external memory and the controller, wherein the compensation circuit comprises:
first through third delay calculators that receive the first through third target delay data and output first through third delay count data, respectively, wherein:
each of the first through third delay calculators also receives the reference clock signal and delay data,
the second target delay data is based on the first target delay data and the third target delay data, and
the first through third delay count data compensates for on-chip PVT variations of the SoC;
a first delay circuit, connected to the first delay calculator, that receives the first delay count data, an input clock signal, and modified first delay count data, and outputs a first clock signal based on at least one of the first delay count data, the modified first delay count data, and the input clock signal;
a second delay circuit, connected to the second delay calculator and the first delay circuit, that receives the second delay count data and the first clock signal, and outputs a second clock signal;
a third delay circuit, connected to the third delay calculator and the second delay circuit, that receives the third delay count data and the second clock signal, and outputs a third clock signal, wherein the first through third delay circuits are connected in series;
a first latch connected to the external memory for receiving data stored in the external memory, and connected to the first delay circuit for receiving the first clock signal, wherein the first latch outputs start-point data based on the first clock signal;
a second latch connected to the external memory for receiving the data stored in the external memory, and connected to the second delay circuit for receiving the second clock signal, wherein the second latch outputs mid-point data based on the second clock signal;
a third latch connected to the external memory for receiving the data stored in the external memory, and connected to the third delay circuit for receiving the third clock signal, wherein the third latch outputs end-point data based on the third clock signal;

a first comparator connected to the first and second latches;

a second comparator connected to the second and third latches, wherein:

the first comparator receives and compares the start-point data and the mid-point data, and outputs an increment signal based on the comparison between the start-point data and the mid-point data;

the second comparator receives and compares the mid-point data and the end-point data, and a decrement signal based on comparison between the mid-point data and the end-point data; and a delay control circuit connected to the first delay calculator and at least one of the first and second comparators, wherein the delay control circuit receives the first delay count data and at least one of the increment and decrement signals, and outputs the modified first delay count data based on the first delay count data and the at least one of the increment and decrement signals, wherein the modified first delay count data compensates for the off-chip PVT variations of the external memory.

16. The system of claim 15, wherein the compensation circuit further comprises:

a phase detector that receives a delayed reference clock signal and the reference clock signal, determines a phase shift based on difference between a desired phase shift and a phase shift between the reference clock signal and the delayed reference clock signal, and outputs a phase shift signal and a lock signal, wherein the phase shift signal is based on the phase shift, and the lock signal is based on the delayed reference clock signal;

a master delay calculator connected to the phase detector, wherein the master delay calculator receives the phase shift signal and the reference clock signal, determines a delay value and a number of delay taps based on the phase shift signal, and outputs the delay data and fourth delay count data, wherein the delay data corresponds to the delay value and the fourth delay count data corresponds to the number of delay taps; and a master delay circuit connected to the master delay calculator, wherein the master delay circuit receives the fourth delay count data and the reference clock signal, and outputs the delayed reference clock signal based on the fourth delay count data.

17. The compensation circuit of claim 16, wherein the first through third delay circuits, and the master delay circuit each include an equal number of delay taps.

18. The system of claim 16, wherein the phase shift is one of 180° and 360° phase shift.

19. The system of claim 15, wherein:

the compensation circuit is connected to the controller, wherein the compensation circuit receives the reference clock signal and the first through third target delay data from the controller, the controller determines the first target delay data based on a starting point of a read data window, the controller iteratively increases a value of the first target delay data to generate the third target delay data that corresponds to a terminating point of the read data window, and the second target delay data is an average of the first target delay data and the third target delay data.

20. The system of claim 15, wherein the delay control circuit performs at least one of increment and decrement operations on the first delay count data to generate the modified first delay count data.

* * * * *